United States Patent [19]
Kasha et al.

[11] Patent Number: 5,767,722
[45] Date of Patent: Jun. 16, 1998

[54] DELTA SIGMA SWITCH CAPACITOR FILTER USING CURENT FEED FORWARD

[75] Inventors: Dan B. Kasha; Navdeep S. Sooch. both of Austin, Tex.

[73] Assignee: Crystal Semiconductor, Austin, Tex.

[21] Appl. No.: 627,752

[22] Filed: Apr. 2, 1996

[51] Int. Cl.⁶ .................................................. H03K 17/16
[52] U.S. Cl. ...................... 327/317; 327/319; 327/333; 327/306; 327/362; 327/554; 326/30; 326/62
[58] Field of Search ............................ 327/554, 379, 327/333, 94, 362, 317, 319, 108; 326/30, 62, 63; 333/173, 12; 341/150, 144

[56] References Cited

U.S. PATENT DOCUMENTS

| | | | |
|---|---|---|---|
| 5,079,550 | 1/1992 | Sooch et al. | 341/143 |
| 5,140,279 | 8/1992 | Scott, III | 330/156 |
| 5,245,344 | 9/1993 | Sooch | 341/150 |
| 5,376,936 | 12/1994 | Kerth et al. | 341/150 |

OTHER PUBLICATIONS

Gray, Paul R., et al., "Analysis and Design of Analog Integrated Circuits", University of California, Berkeley, pp. 253–267.

Horowitz, Paul et al., "The Art of Electronics", Cambridge University Press, pp. 266–267.

*Primary Examiner*—Timothy P. Callahan
*Assistant Examiner*—Dinh Le
*Attorney, Agent, or Firm*—Ken J. Koestner; J. P. Violette

[57] ABSTRACT

An electronic circuit having a circuit stage, such as a switched capacitor stage or a 1-bit digital-to-analog converter and switched capacitor filter, that is loaded with a load impedance employs current feedforward to substantially cancel effects of the load impedance. A circuit includes a circuit stage and a load impedance following and connected to the circuit stage. A current feedforward circuit is connected to the load impedance, substantially cancelling the load impedance to improve linearity of the digital-to-analog converter or switched capacitor filter.

48 Claims, 16 Drawing Sheets ary of the present invention, various currents and elements are described.

DELTA SIGMA SWITCH CAPACITOR FILTER USING CURENT FEED FORWARD

FIELD OF INVENTION

The present invention relates generally to electronic circuits that are loaded with a load impedance. More specifically, the invention relates to electronic circuits including a switched capacitor stage in which a load impedance is canceled using current feedforward.

BACKGROUND OF THE INVENTION

In various circuits, loading occurs which adversely affects circuit performance. One example of such a circuit implementation 100 is shown in FIG. 1, in which a switched capacitor digital-to-analog converter (DAC) 110 forms a first stage of the circuit 100 and a continuous-time filter 120 forms a second stage. A load impedance $Z_L$ arises between the two stages so that an operational amplifier 112 in the DAC 110 must supply current $I_{ZL}$ to the load impedance $Z_L$. As a result of this output current, the operational amplifier 112 output stage bias changes in accordance with the voltage $V_O$ at the output of the DAC 110, degrading performance of the circuit 100. What is desired is a technique and circuit that forms a negative impedance and supplies a feedforward current that counters the load impedance $Z_L$.

One conventional circuit 200 that performs current forward feeding is shown in FIG. 2. The conventional circuit 200, which is connected to an output terminal of a first stage circuit in accordance with the circuit 100 shown in FIG. 1 and forms a negative impedance to supply a feedforward current countering the load impedance, includes an operational amplifier 210, two PMOS transistors 212 and 214, an NMOS transistor 216 and a load $Z_{L1}$ and a matching load impedance circuit $Z_{L2}$ which matches the load $Z_{L1}$. A voltage $V_O$ from the first stage (not shown) is connected across the load $Z_{L1}$ and appears substantially as voltage $V_M$ across the matching load impedance circuit $Z_{L2}$. The current $I_{ZL2}$ in the matching load impedance $Z_{L2}$ varies around a bias point with the same variability as the current through the load $Z_{L1}$. The current $I_{ZL2}$ is mirrored with PMOS transistors 212 and 214 and supplies the current to load $Z_{L1}$.

One problem that occurs in the conventional circuit 200 arises because the gate of NMOS transistor 216 must rise to a voltage greater than the voltage $V_O$, leaving little headroom in the circuit path from the VDD power source and VSS reference. Furthermore, stability of the conventional circuit 200 can be difficult to achieve.

What is needed is a current feedforward circuit that reduces headroom problems and improves circuit stability.

SUMMARY OF THE INVENTION

In accordance with the present invention, an electronic circuit having a circuit stage, such as a switched capacitor stage or a 1-bit digital-to-analog converter and switched capacitor filter, that is loaded with a load impedance employs current feedforward to substantially cancel effects of the load impedance.

In accordance with an embodiment of the present invention, a two-stage circuit in which the second stage presents a resistive and/or reactive load on the first stage. Thus, the two-stage circuit includes a circuit stage and a load impedance following and connected to the circuit stage. A current feedforward circuit is connected to the load impedance, substantially cancelling the load impedance to improve linearity of the digital-to-analog converter or switched capacitor filter.

In accordance with a specific embodiment of the present invention, the current feedforward circuit is a negative-impedance circuit which includes a differential pair of NMOS driver transistors including an inverting-input NMOS driver transistor having a drain, a source and a gate connected to the drain, and a noninverting-input NMOS driver transistor having a source connected to the inverting-input NMOS driver transistor source, a drain and a gate. The current feedforward circuit also includes a first PMOS active load transistor having a drain connected to the drain of the inverting-input NMOS driver transistor, a source connected to a power source and a gate and a second PMOS active load transistor having a drain connected to the drain of the noninverting-input NMOS driver transistor, a source connected to the source of the first PMOS active load transistor and a gate connected to the gate of the first PMOS active load transistor, the gate also being connected to the drain. The current feedforward circuit additionally includes a feedforward current mirror PMOS transistor having a drain connected to the gate of the noninverting-input NMOS driver transistor, a source connected to the power source and a gate connected to the gates of the first and second PMOS active load transistors. Additionally, the feedforward circuit includes a current source connected to the sources of the inverting-input NMOS driver transistor and the noninverting-input NMOS driver transistor and a load resistor connected to the gate of the inverting-input NMOS driver transistor.

The current feedforward circuit described above achieves numerous advantages. One advantage is that the circuit cancels a load impedance, thereby improving the performance of the circuit driving this load. Cancellation of the load impedance advantageously improves linearity of the digital-to-analog converter or switched capacitor filter. Another advantage is that the described circuit avoids headroom limitations. Still another advantage is that the described circuit has improved circuit stability and speed.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIGS. 9A and 9D respectively depict schematic circuit diagrams of a circuit with a feedforward path disconnected and connected. FIGS. 9B and 9C graphically show the response of the circuit shown in FIG. 9A. FIGS. 9E and 9F graphically illustrate the response of the circuit shown in FIG. 9D.

DETAILED DESCRIPTION

Figure 1:
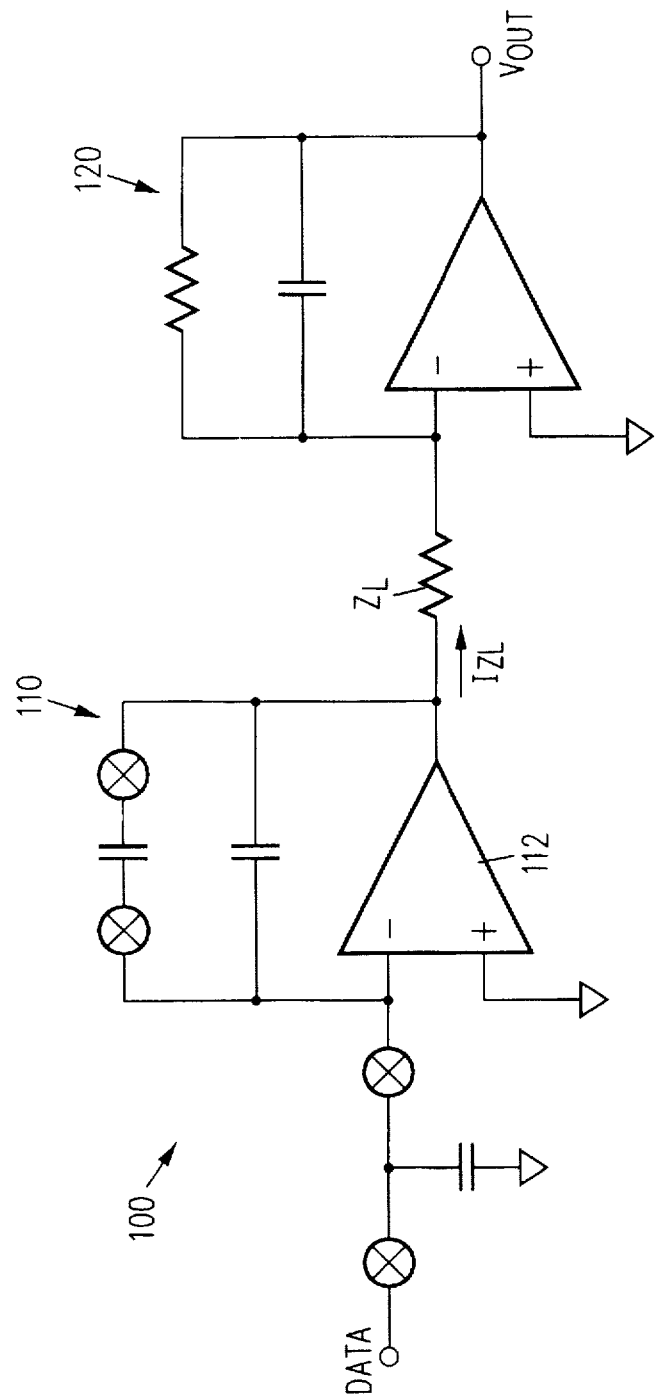
FIG. 1, labeled prior art, is a schematic circuit diagram which illustrates two stages of a circuit in which the second stage presents a resistive and/or capacitive load on the first stage.
Figure 2:
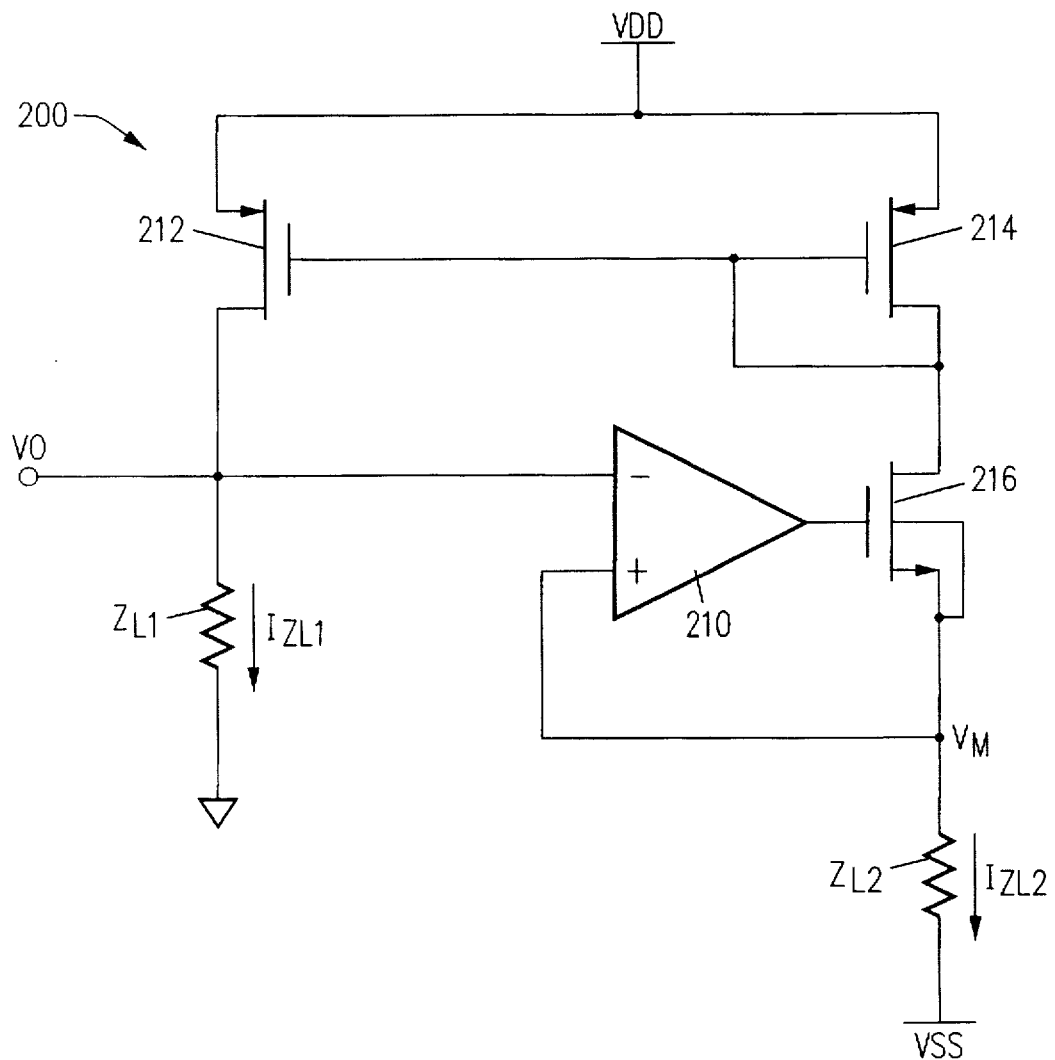
FIG. 2, labeled prior art, is a schematic circuit diagram showing a current feedforward circuit which solves some of the problems that arise due to an impedance loading.
Figure 3:
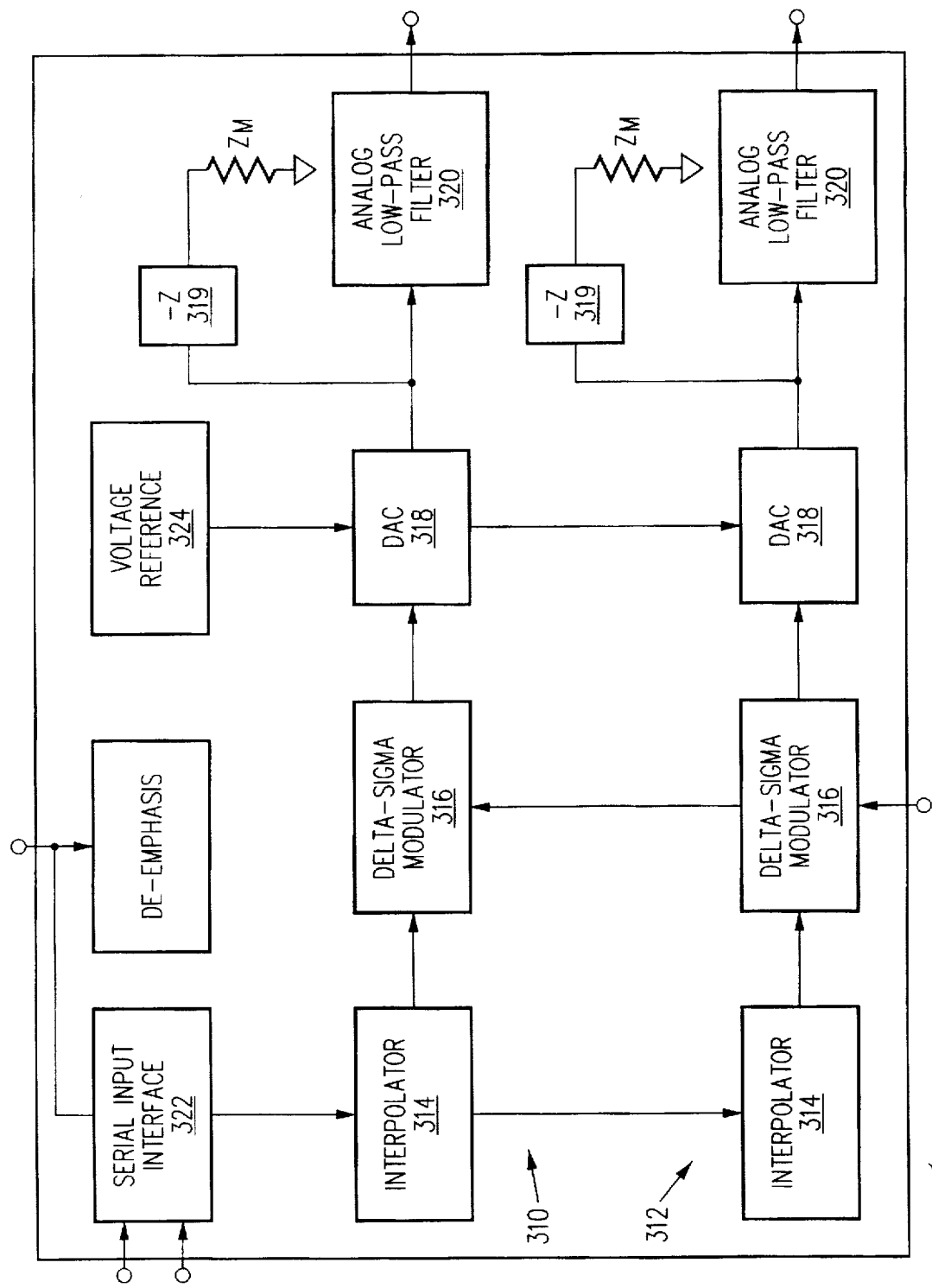
FIG. 3 is a schematic block diagram of an exemplary circuit which includes a current feedforward circuit in accordance with an embodiment of the present invention, specifically the exemplary circuit is a stereo digital-to-analog (D/A) output system.

Referring to FIG. 3, an example of a circuit incorporating a feedforward circuit is a stereo digital-to-analog (D/A) output system 300 having two channels 310 and 312, each of which includes an interpolator 314, a delta-sigma modulator 316, a switched capacitor digital-to-analog converter (DAC) 318, a feedforward circuit 319 and an analog low-pass filter 320. In each channel, the interpolator 314 supplies signals to the delta-sigma modulator 316. The delta-sigma modulator 316 output signal is a digital reference voltage signal, which is converted to analog form by the DAC 318 and applied to the low-pass filter 320, which has a highly-linear transfer characteristic. The low-pass filter 320 imposes a resistive and/or capacitive loading on the DAC 318. The feedforward circuit 319 substantially cancels the effects of the load impedance which includes a resistive and/or capacitive load. The feedforward circuit 319 serves as a negative-impedance converter, which converts an impedance to a negative impedance with the same size resistive and/or capacitive (reactive) component as the impedance imposed by the low-pass filter 320.

The stereo D/A output system 300 also includes a serial input interface 322 for applying input signals to the interpolators 314 of each channel 310 and 312. A voltage reference 324 is applied to the DACs 318 of each channel 310 and 312.

Figure 4:
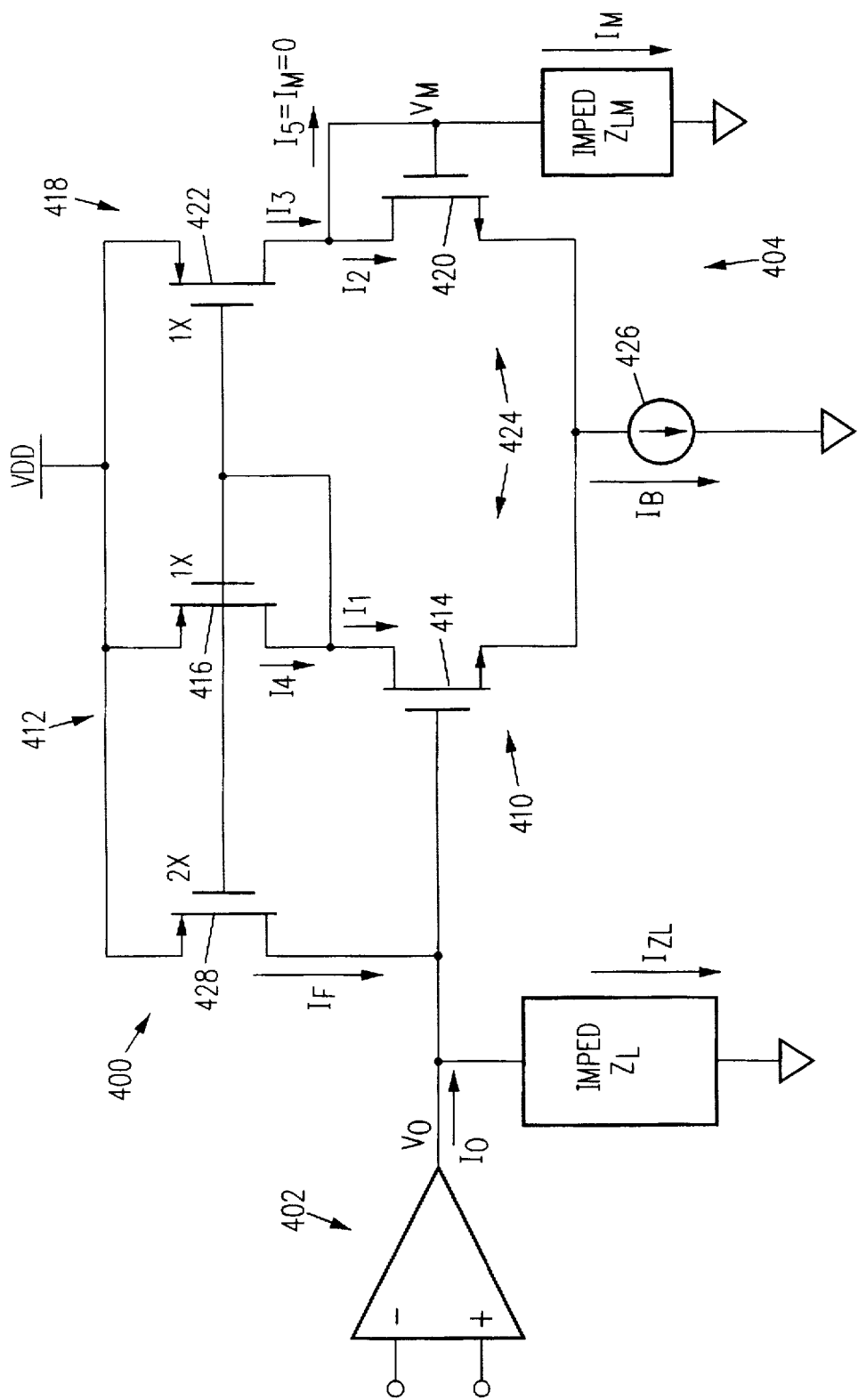
FIG. 4 is a schematic circuit diagram showing a current feedforward circuit in accordance with an embodiment of the present invention.

Referring to FIG. 4, a portion 400 of the stereo D/A output system 300 is shown which includes a stage, which may be one stage of a plurality of stages in an electronic circuit system, and a current feedforward circuit 404. The stage is a switched-capacitor digital-to-analog converter (DAC) 402 which generates a voltage $V_O$ and a current $I_O$. A load, such as a load impedance $Z_L$ which may be a resistive load, a capacitive load or a mixed resistive and capacitive load, is imposed on an output terminal of the DAC 402. The load $Z_L$ is imposed, for example by a resistor, but may also be imposed by other circuits such as an additional circuit stage. The current feedforward circuit 404 includes a common-source differential amplifier 410. The output terminal of the DAC 402 is connected to the input terminal of the current feedforward circuit 404 and to a following circuit stage that is modelled herein as a load impedance $Z_L$.

The common-source differential amplifier 410 has a first pair 412 of transistors including an NMOS driver 414 and a PMOS active load 416 and a second pair 418 of transistors including an NMOS driver 420 and a PMOS active load 422. The source terminals of the PMOS active loads 416 and 422 are connected at a VDD power source terminal and the gate terminals of the PMOS active loads 416 and 422 are connected. The gate and drain terminals of the PMOS active load 416 are also connected. The source terminals of the NMOS drivers 414 and 420 are connected to a bias current source 426 which generates a bias current $I_B$. A differential pair 424 of transistors formed by NMOS driver 414 and NMOS driver 420 functions as a unity-gain amplifier having a feedback connection from the gate terminal to the drain terminal of NMOS driver 420. The NMOS driver 420 serves as an inverting input terminal and the NMOS driver 414 serves as a noninverting input terminal to the differential pair 424. The gate terminal of NMOS driver 420 is connected to a matching load impedance $Z_{LM}$. Since a voltage $V_M$, which matches the voltage $V_O$, is applied across the matching load impedance $Z_{LM}$, a matching current $I_M$, which matches the current flowing into $Z_L$ flows into the matching load impedance $Z_{LM}$. The differential pair 424 of transistors with an active load, as shown, supplies half the current $I_M$ from the PMOS active load 422 and half the matching current $I_M$ from the NMOS driver 420. The current conducted in PMOS active load 422 contains half the matching current $I_M$, as well as half the bias current $I_B$. A PMOS mirror transistor 428 functions as a 2X current mirror, mirroring the current conducting in the PMOS active load 422. Although the PMOS mirror transistor 428 functions as a 2X current mirror in this illustrative embodiment, other mirroring ratios may be implemented in other embodiments, as is known in the art with the impedances $Z_M$ amd $Z_{LM}$ adjusted accordingly. The PMOS mirror transistor 428 has a source terminal connected to VDD power source and connected to the source terminals of the PMOS active loads 416 and 422, a drain terminal connected to the gate terminal of NMOS driver 414 and a gate terminal connected to the gate terminals of the gate terminals of the PMOS active loads 416 and 422. The current conducting in the PMOS mirror transistor 428 is a feedforward current $I_F$, which is equal to the sum of an input load current $I_{ZL}$ and the bias current $I_B$ when the impedances $Z_L$ and $Z_{LM}$ are equal. Accordingly, when the matching load impedance $Z_{LM}$ is equal to the input load impedance $Z_L$, the feedforward current $I_F$ is evaluated according to the equation (1), as follows:

$$I_F = V_O/Z_L + I_B. \quad (1)$$

The bias of the first stage, the switched-capacitor digital-to-analog converter (DAC) 402, is typically adjusted to absorb the bias current $I_B$ and the effect is that the remaining portion of the feedback current $I_F$ is substantially equal to the load current $I_{ZL}$ through the impedance $Z_L$. Thus, the DAC 402 is not required to supply the input load current $I_{ZL}$ conducted through the input load impedance $Z_L$.

The matching load impedance $Z_{LM}$ is substantially matched to the impedance of input load impedance $Z_L$ to achieve impedance matching and proper operation. The tolerance of how well impedances $Z_L$ and $Z_{LM}$ are to be matched depends on two factors. First, the matching of voltage $V_O$ to voltage $V_M$ and the matching of impedance $Z_L$ to impedance $Z_{LM}$ are to be sufficient to match the current $I_M$ to the current $I_{ZL}$ adequately so that resulting variations in the current $I_O$ do not disturb DAC 402. Second, the impedances $Z_L$ and $Z_{LM}$ are to match as well as the voltage $V_O$ matches voltage $V_M$. The bias current $I_B$ generated by the bias current source 426 is specified to be greater than the maximum input load current $I_{ZL}$.

In one group of embodiments, the input load impedance $Z_L$ is internal to a circuit chip and the matching load impedance $Z_{LM}$ is also internal to the circuit chip, including on-chip resistive, capacitive and/or inductive components so that the impedances $Z_L$ and $Z_{LM}$ substantially match. In a second group of embodiments, the input load impedance $Z_L$ is formed by an external load or external circuitry and the matching load impedance $Z_{LM}$ is also formed by an external load or circuitry including resistive, capacitive and/or inductive components that are selected to match the input load impedance $Z_L$. In a third group of embodiments, the input load impedance $Z_L$ is internal to a circuit chip while the matching load impedance $Z_{LM}$ is supplied externally. In a fourth group of embodiments, the input load impedance $Z_L$ is external to a circuit chip while the matching load impedance $Z_{LM}$ is supplied internally. In the third and fourth groups of embodiments, matching is difficult to achieve.

The differential amplifier 410 utilizes a transistor, specifically the PMOS active load 422, to furnish a high open loop voltage gain without requiring a large power supply voltage. Typical values for the voltage gain are in the 30 to 300 range so that the actively loaded stage supplies a very high gain and results in adequate matching of $V_O$ and $V_M$ for most applications. An alternative embodiment utilizes a two-stage amplifier to achieve higher gain.

In addition to furnishing a high voltage gain, the differential amplifier circuit 410 also converts from a differential signal to an output signal that is referenced to ground.

Figure 5:
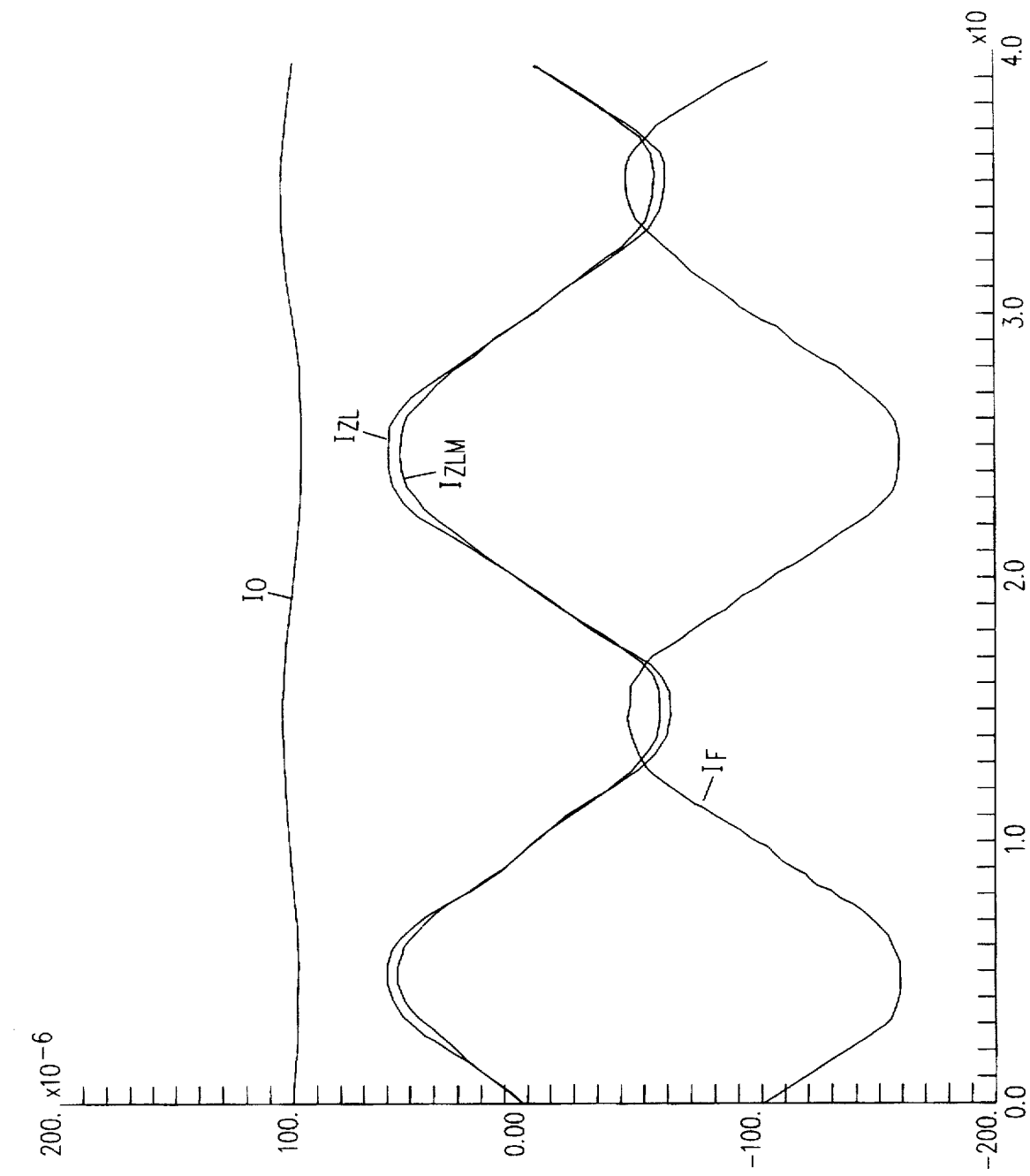
FIG. 5 is a graph which illustrating a simulated plot of various currents varying in time to illustrate the performance of the feedforward circuit shown in FIG. 4.

Referring to FIG. 5, a graph shows a simulated plot of various currents varying in time to illustrate the performance of the differential amplifier circuit 410. Specifically, plots of the DAC 402 output current $I_O$, load current $I_{ZL}$, matching load current $I_{ZLM}$ and feedforward current $I_F$ are illustrated. The graph shows that the output signal voltage $V_O$ at the DAC 402 output terminal supplies a relatively constant DAC current $I_O$. The small variation in DAC current $I_O$ results from finite amplifier gain of the current feedforward circuit 404. The substantial similarity between the wave forms of the input load current $I_{ZL}$ and the matching load current $I_{ZLM}$ illustrate the signal matching achieved by the differential amplifier 410.

Figure 6A:
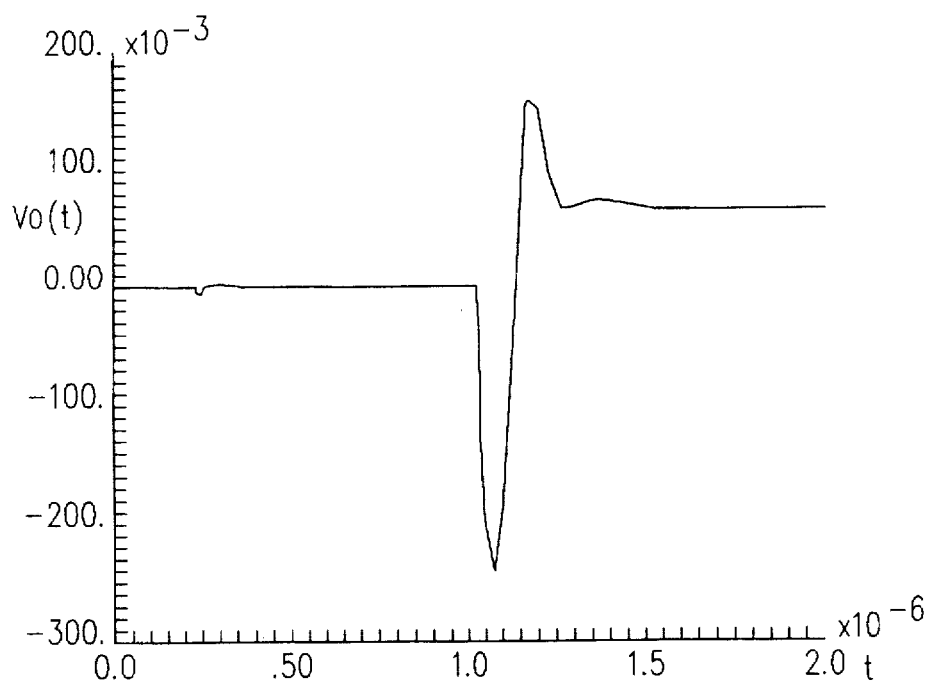
FIGS. 6A and 6B are transient response graphs illustrating transient simulation responses of the feedforward circuit shown in FIG. 4.
Figure 6B:
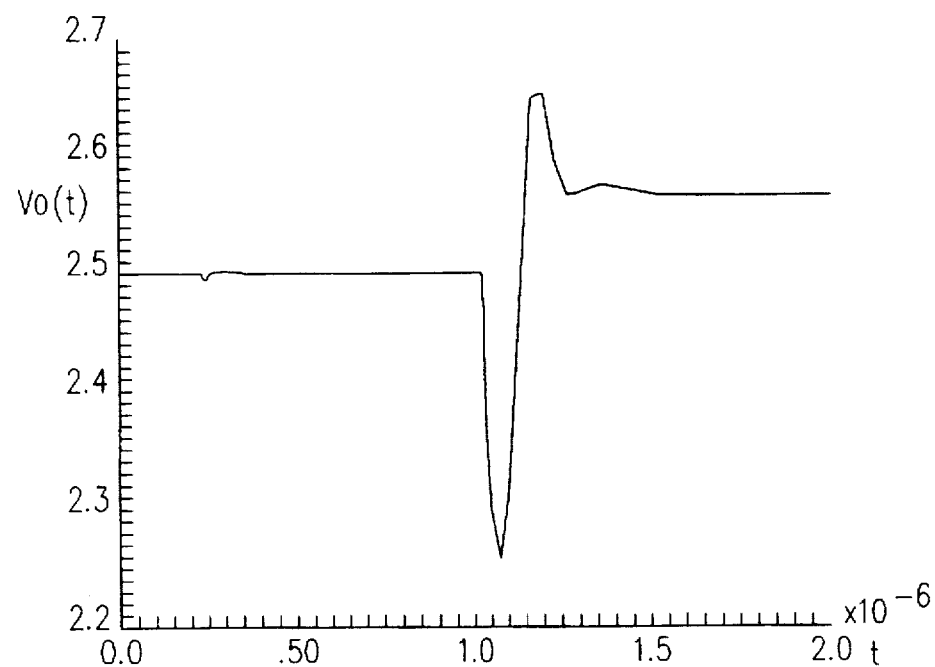

Referring to FIGS. 6A and 6B, transient response graphs illustrate a transient simulation with a DAC output voltage $V_O$ of 0 V and a transient simulation with a DAC output voltage $V_O$ of 2.5 V, respectively. The amplitude and structure of the two transient responses are essentially identical, showing that the two responses are matched although the current $I_{ZL}$, which in the absence of the feedforward current $I_{FF}$ would be supplied by the DAC 402, is substantially different.

Figure 7:
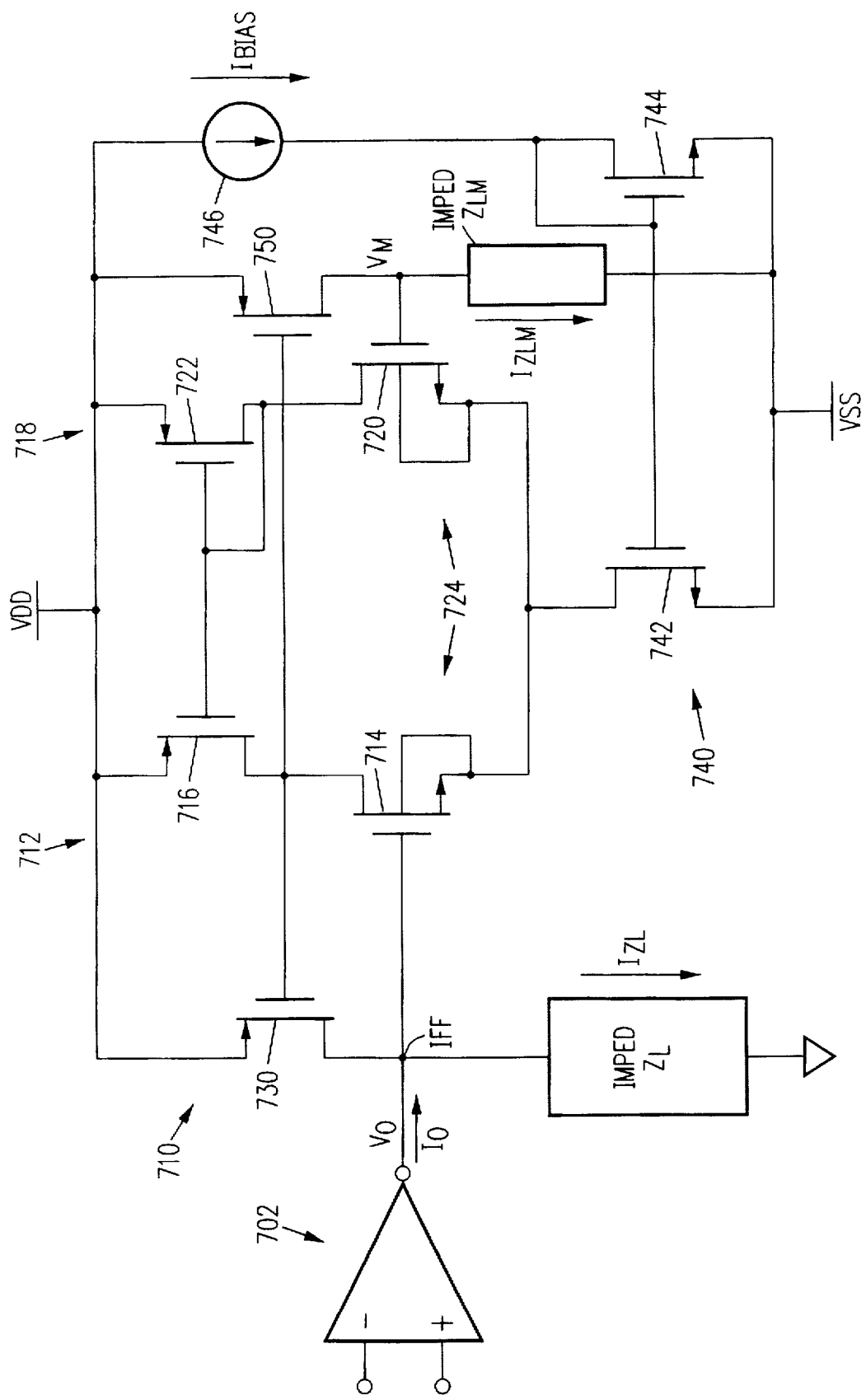
FIG. 7 is a schematic circuit diagram showing a current feedforward circuit in accordance with a further alternative embodiment of the present invention.

Referring to FIG. 7, an alternative embodiment of a current feedforward ($I_{FF}$) cell 710 is illustrated which has improved performance through the usage of a two-stage amplifier 724. Current feedforward cell 710 includes a first pair 712 of transistors including an NMOS driver 714 and a PMOS active load 716 and a second pair 718 of transistors including an NMOS driver 720 and a PMOS active load 722. Both the first and second circuit pairs 712 and 718 are connected between the VDD power source and the connected source terminals of the NMOS drivers 714 and 720. The gate terminals of the PMOS active load transistors 716 and 722 are interconnected and connected to the drain terminal of PMOS load transistor 722. The NMOS driver 720 serves as an inverting input terminal and the NMOS driver 714 serves as a noninverting input terminal to the two stage amplifier 724. The gate terminal of NMOS driver 720 is connected to a node $V_M$, which also is connected to the matched load $Z_{LM}$, and forms a unity gain connection of the two-stage amplifier 724. An input voltage $V_O$ is applied to the noninverting input terminal of the two stage amplifier 724 and a matching load voltage $V_M$ is accessed from the matched loading terminal at the drain terminal of a second stage drive PMOS transistor 750.

Current feedforward is supplied by a PMOS feedforward transistor 730 which has a source terminal connected to the VDD power source, a drain terminal connected to the gate terminal of NMOS driver 714, and a gate terminal connected to the coupled drains of PMOS active load 716 and NMOS driver 714. In this illustrative embodiment, the current feedforward cell 710 has a biasing element 740 which includes a first NMOS transistor 742 having a drain terminal connected to the connected source terminals of the NMOS drivers 714 and 720, a source terminal connected to a VSS reference. Other biasing schemes, which are known in the art, may also be employed. A second NMOS transistor 744 has a source terminal connected to the source terminal of the first NMOS transistor 742 at the VSS reference and a drain terminal and gate terminal which are interconnected and connected to a BIAS element or pin, if an external bias is furnished. The gates of NMOS transistors 742 and 744 are interconnected.

A second stage drive PMOS transistor 750 contains the same current variations as the variations in current $I_{ZL}$ if the impedance $Z_{LM}$ matches the impedance $Z_L$. PMOS transistor 730 mirrors this current to the node $I_{FF}$ thereby supplying this current to the impedance $Z_L$. The matching load PMOS transistor 750 has a source terminal connected to the VDD power source, a drain terminal connected to the matching load impedance $Z_{LM}$ and connected to the gate terminal of NMOS driver 720, and a gate terminal connected to the coupled drain terminals of the PMOS active load 716 and the NMOS driver 714. The matching load impedance $Z_{LM}$ is connected between the drain terminal of the matching load PMOS transistor 750 and the VSS reference. A matching load current $I_{ZLM}$ is conducted by the matching load PMOS transistor 750.

The matching load current $I_{ZLM}$, which is the current conducted through the matching load impedance $Z_{LM}$, is equal to the feedforward current $I_{FF}$ in accordance with Equation (2):

$$I_{FF} = I_{ML} = \frac{V_M - V_{SS}}{Z_{ML}}, \tag{2}$$

where the input voltage $V_O$ is substantially equal to the matching current voltage $V_M$. The bias current $I_{BIAS}$ is the current $I_{ZML}$ conducted through the matching load impedance $Z_{ML}$ resulting from the voltage VSS so that in equation (3):

$$I_{FF} = \frac{V_o}{Z_{ML}} + I_{BIAS}. \tag{3}$$

In an alternative embodiment, the input transistors—the NMOS driver transistors 714 and 720—are replaced with PMOS transistors and other transistors in the current feedforward cell 710 are switched with complementary transistors. In this alternative embodiment, the matching load impedance $Z_{LM}$ is connected to the VDD power supply, rather than to the VSS reference.

Figure 8:
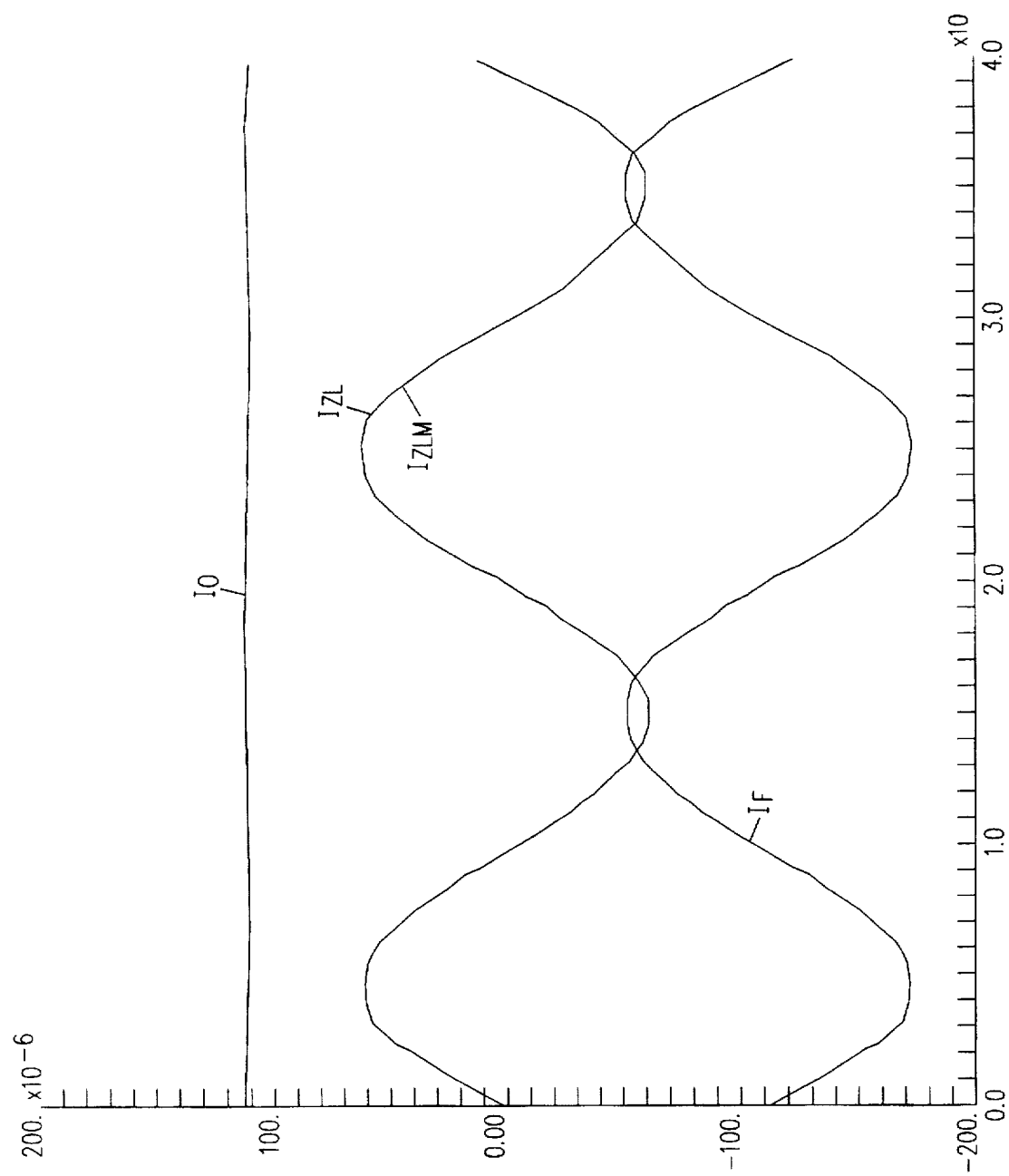
FIG. 8 is a graph which illustrating a simulated plot of various currents varying in time to illustrate the performance of the current feedforward circuit shown in FIG. 7.

FIG. 8 illustrates a graph showing a simulated plot of various currents varying in time to illustrate the performance of the current feedforward cell circuit 710. Plots of a DAC output current $I_O$, input load current $I_{ZL}$ and matching load current $I_{ZLM}$ are shown. The graph shows that the DAC output voltage $V_O$ supplies a relatively constant DAC output current $I_O$. The substantial similarity between the wave forms of the input load current $I_{ZL}$ and the matching load current $I_{ZLM}$ illustrate the signal matching achieved by the current feedforward cell 710.

Figure 9A:
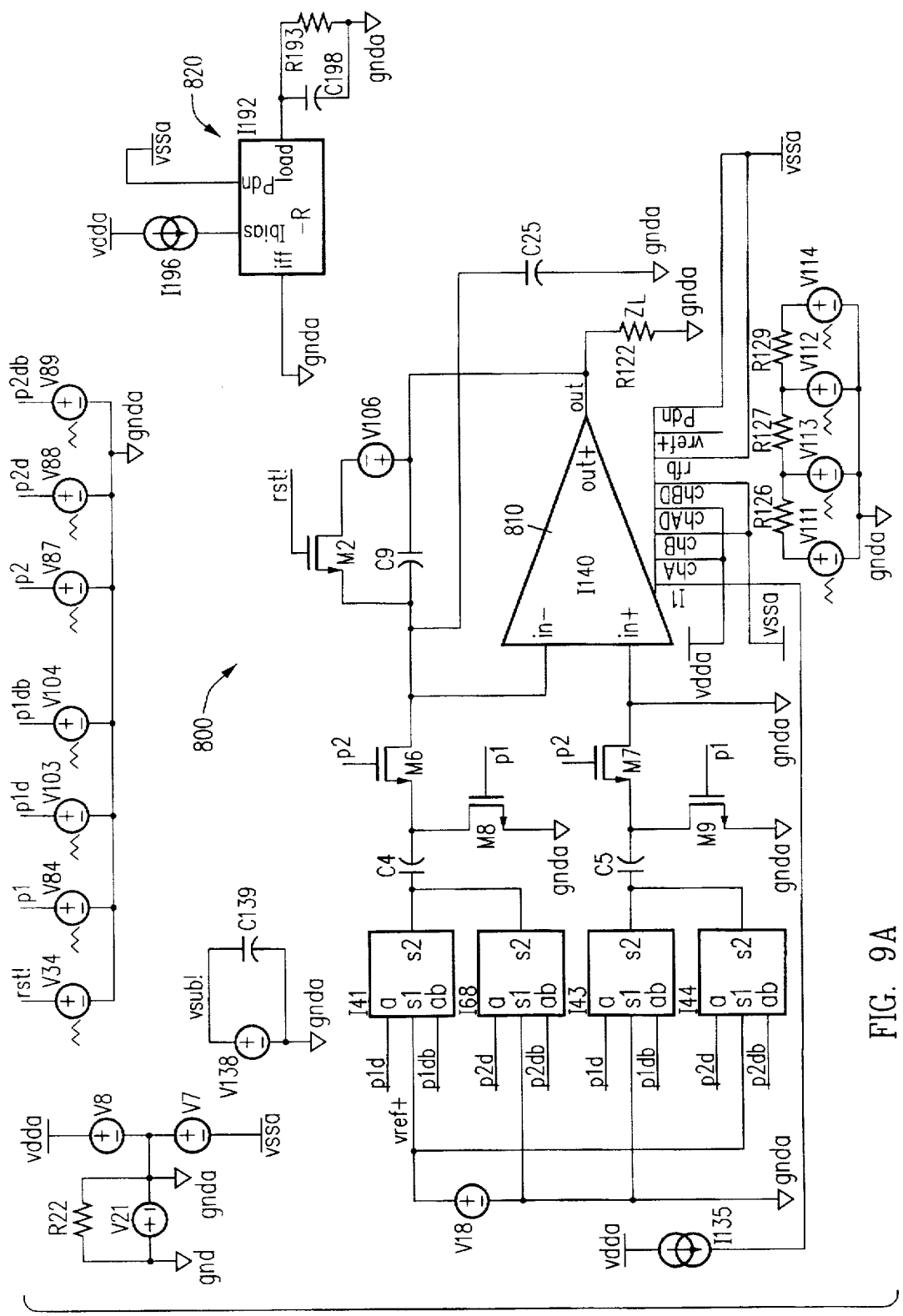
FIGS. 9A through 9F include schematic circuit diagrams and transient response graphs to illustrate improved circuit performance achieved using current feedforward.
Figure 9B:
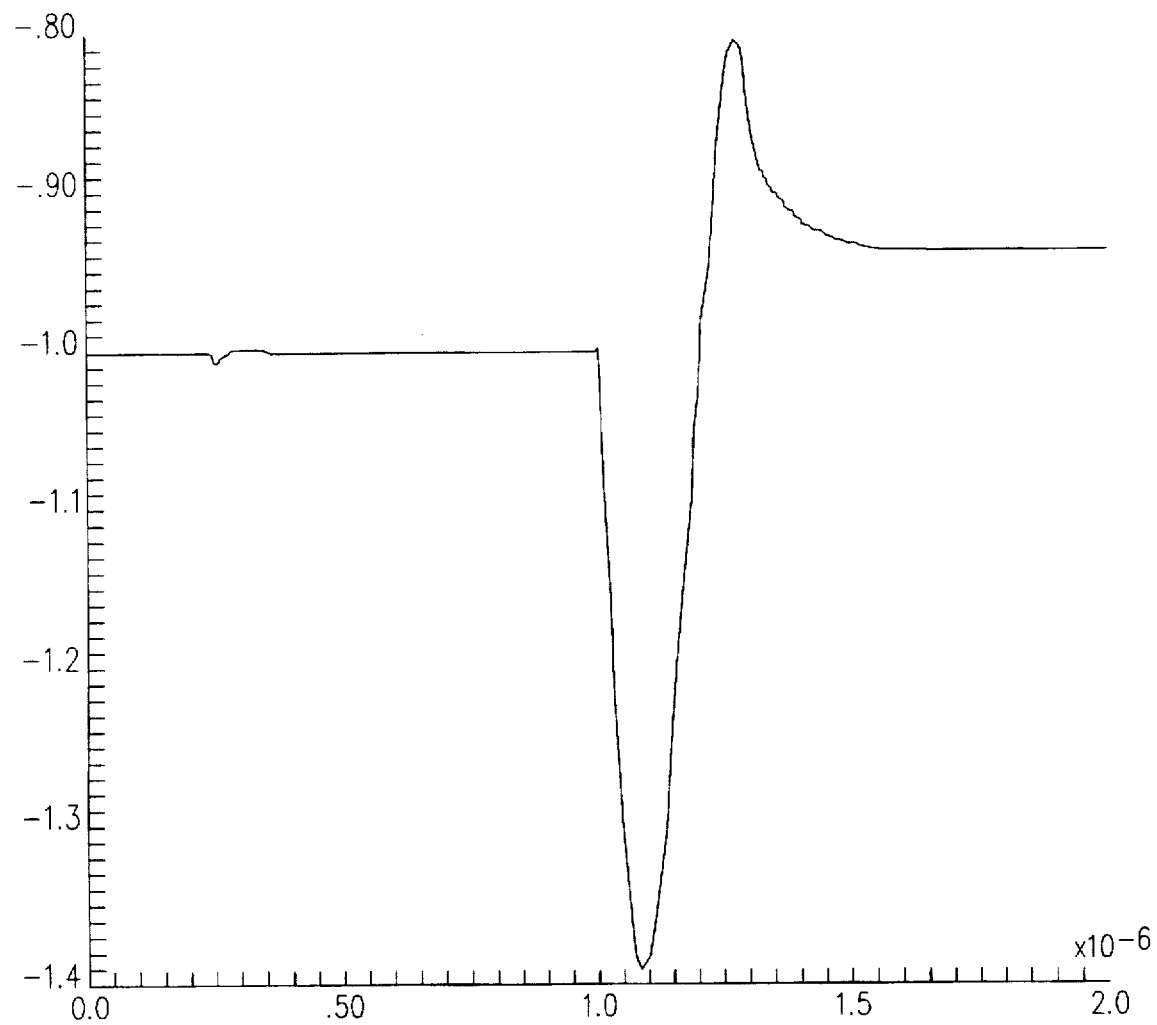

FIGS. 9A through 9F illustrate improved circuit performance achieved using current feedforward. FIG. 9A is a schematic circuit diagram of a switched capacitor DAC stage 800 having a feedforward path disconnected. The switched capacitor DAC stage 800 includes a operational amplifier 810 having an output terminal connected to a load impedance $Z_L$, which is shown as a resistor R122. The operational amplifier 810 is disconnected from a feedforward circuit 820. FIG. 9B depicts a transient response graph illustrating a transient simulation response of the switched capacitor DAC stage 800 with the feedforward circuit 820 disconnected and an output voltage of −1.0V. When the output voltage is −1.0V, the transient response is relatively fast since the load impedance $Z_L$ supplies current to the operational amplifier 810.

Figure 9C:
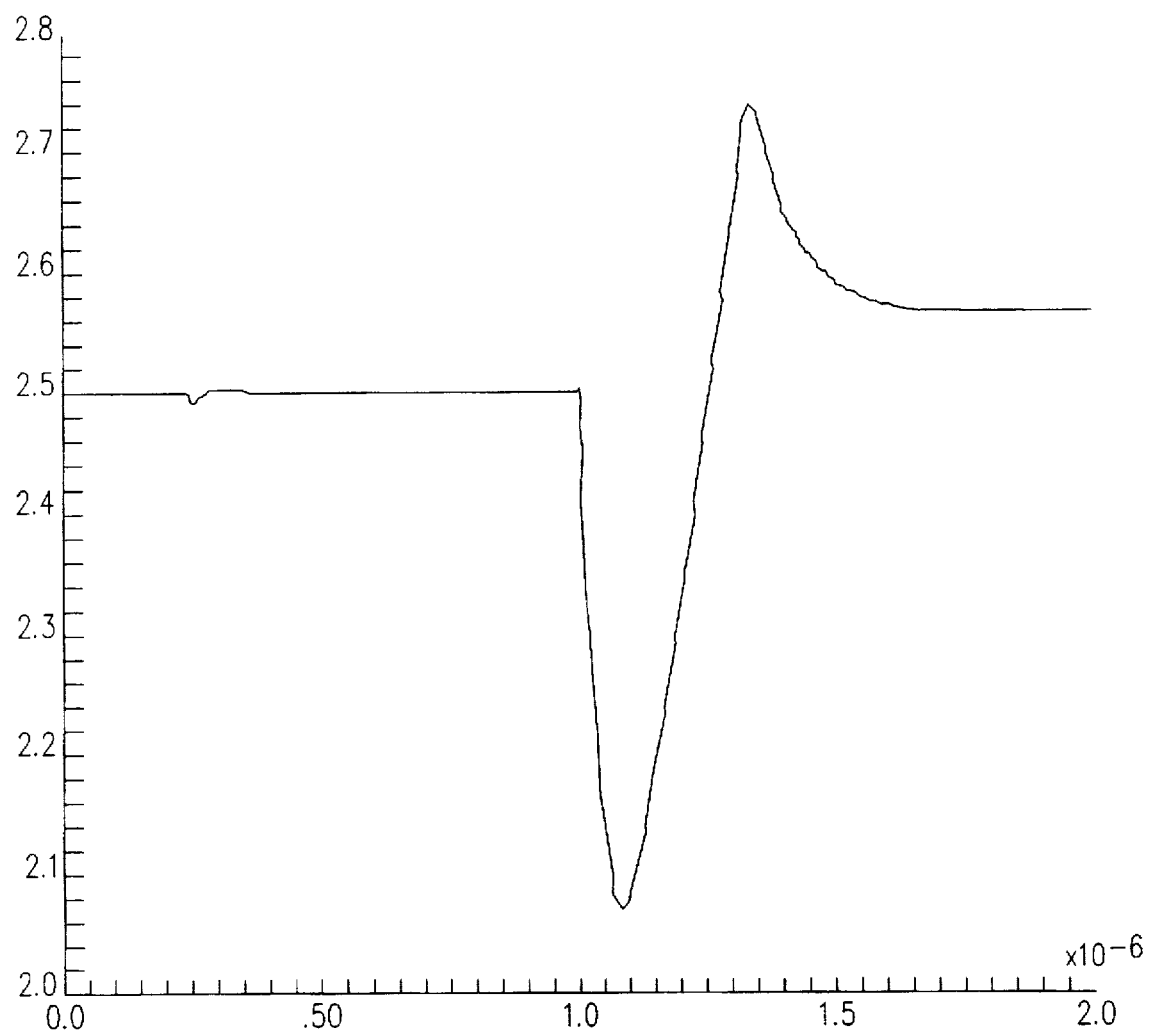

FIG. 9C depicts a transient response graph illustrating a transient simulation response of the switched capacitor DAC stage 800 with the feedforward circuit 820 disconnected and an output voltage of 2.5 V. When the output voltage is 2.5 V, the transient response is slowed because the operational amplifier 810 must supply current to the load impedance $Z_L$. The transient response when the output voltage is 2.5 V is visibly broader than the transient response for a −1.0 V output voltage. Note that a switched capacitor stage having a PMOS drive rather than an NMOS drive would accelerate rather than slow the transient response so that the transient response would be narrower, rather than wider. Thus, in either the PMOS drive or the NMOS drive case, what is desired is a transient response that is substantially the same for all output voltages.

Figure 9D:
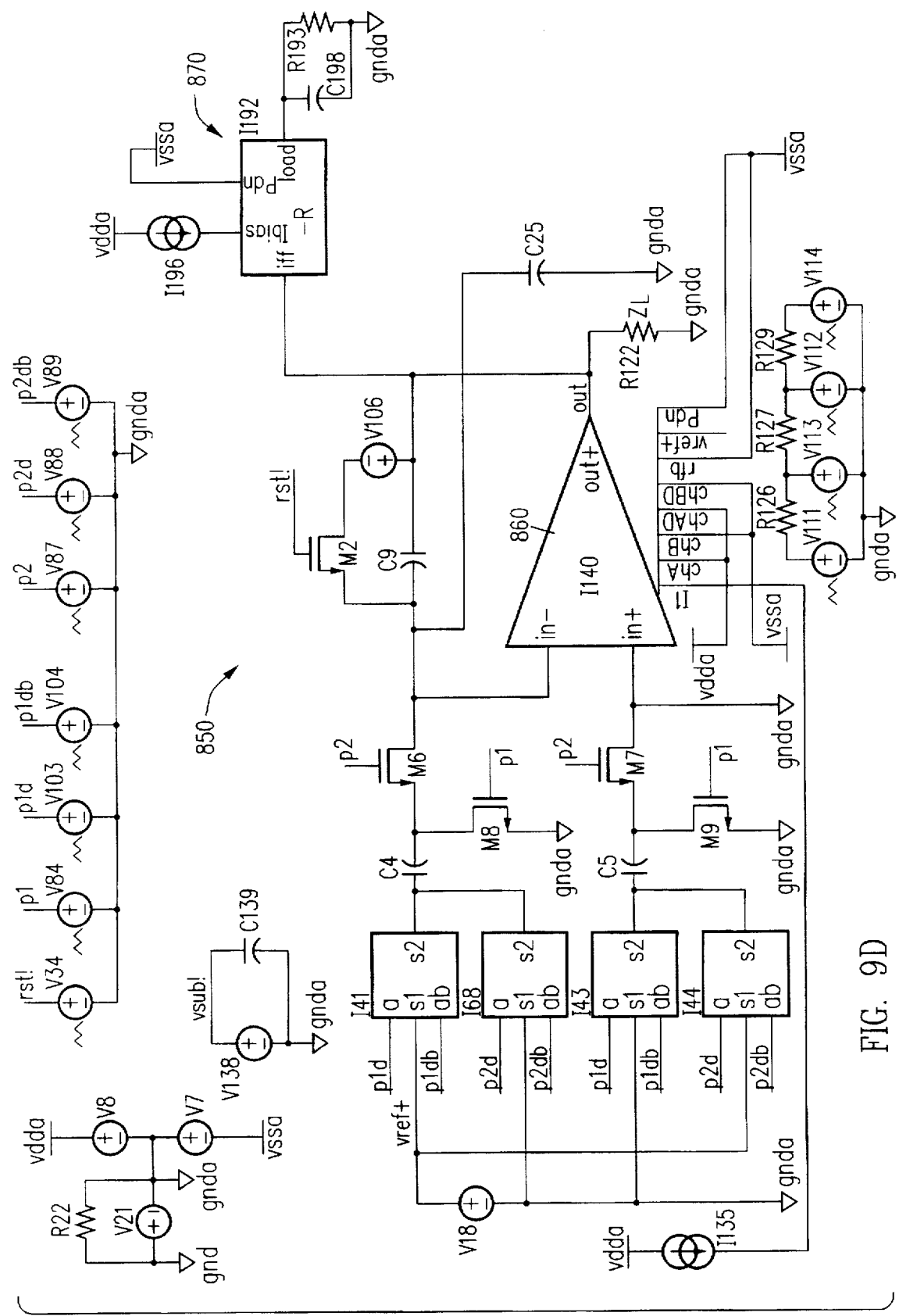
Figure 9E:
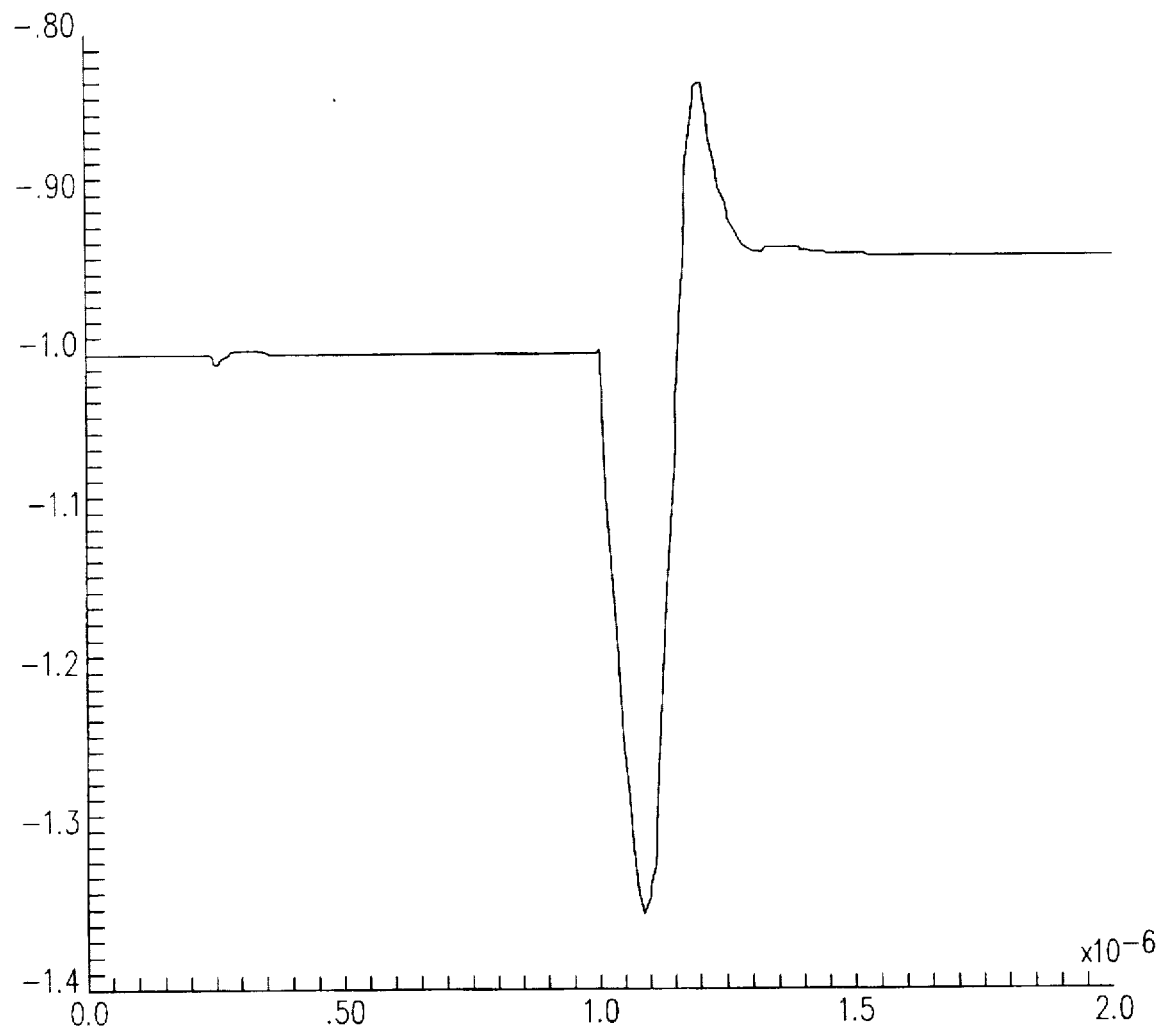
Figure 9F:
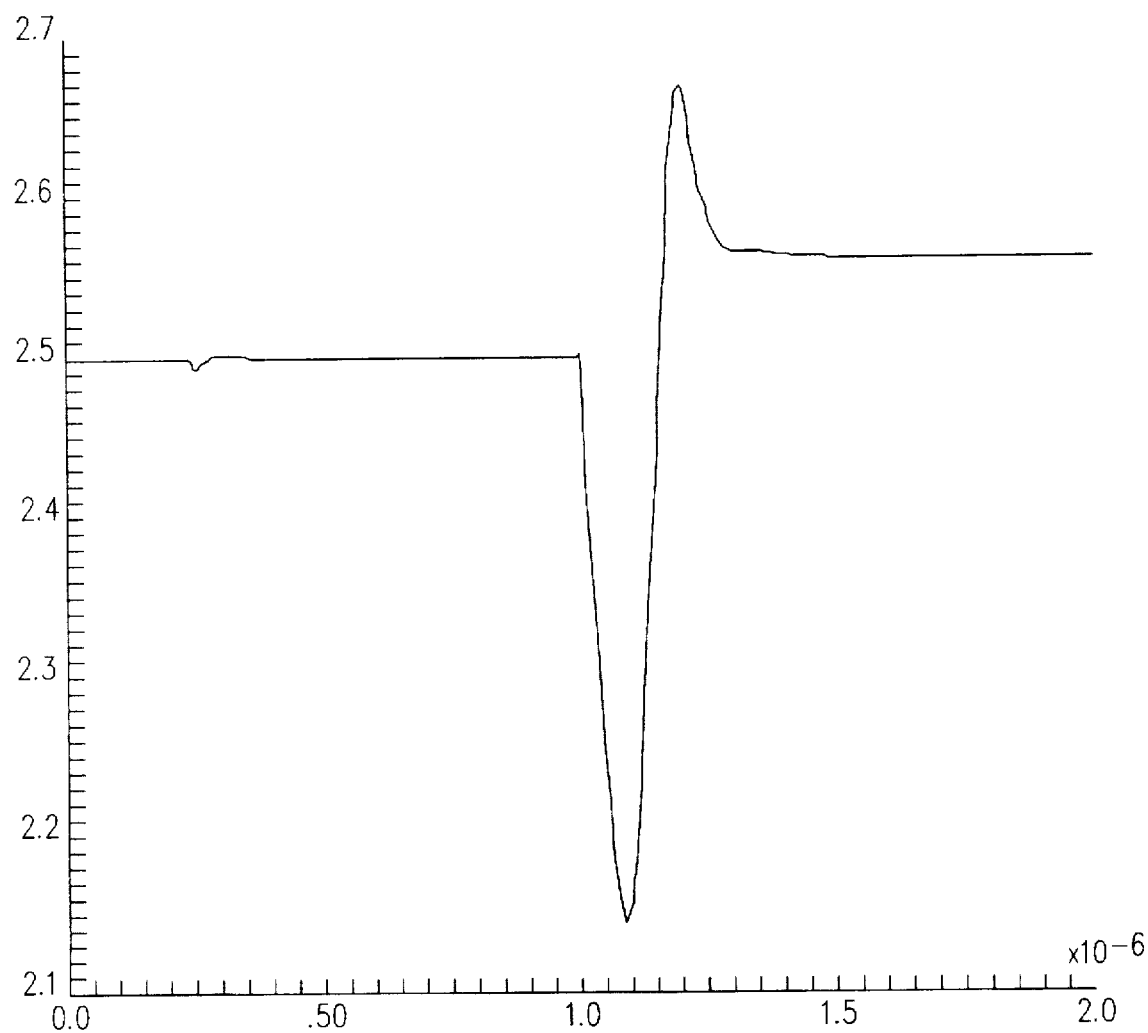

FIG. 9D is a schematic circuit diagram of a switched capacitor stage 850 having a feedforward path connected. The switched capacitor stage 850 includes a operational amplifier 860 having an output terminal connected to a load impedance $Z_L$. The operational amplifier 860 is connected to a feedforward circuit 870. FIG. 9E depicts a transient response graph illustrating a transient simulation response of the switched capacitor stage 850 with the feedforward circuit 870 connected and an output voltage of −1.0 V. FIG. 9F depicts a transient response graph illustrating a transient simulation response of the switched capacitor stage 850 with the feedforward circuit 870 connected and an output voltage of 2.5 V. Whether the output voltage is either −1.0 V, 2.5 V or any voltage in the operating range, the operational amplifier 860 does not need to source or sink the majority of the load current since the current feedforward circuit supplies the load current. Therefore, the transient response at all operating output voltages is relatively fast and virtually identical in timing and shape so that distortion performance of operational amplifier 860 and of the switched capacitor DAC stage 850 is improved.

Figure 10:
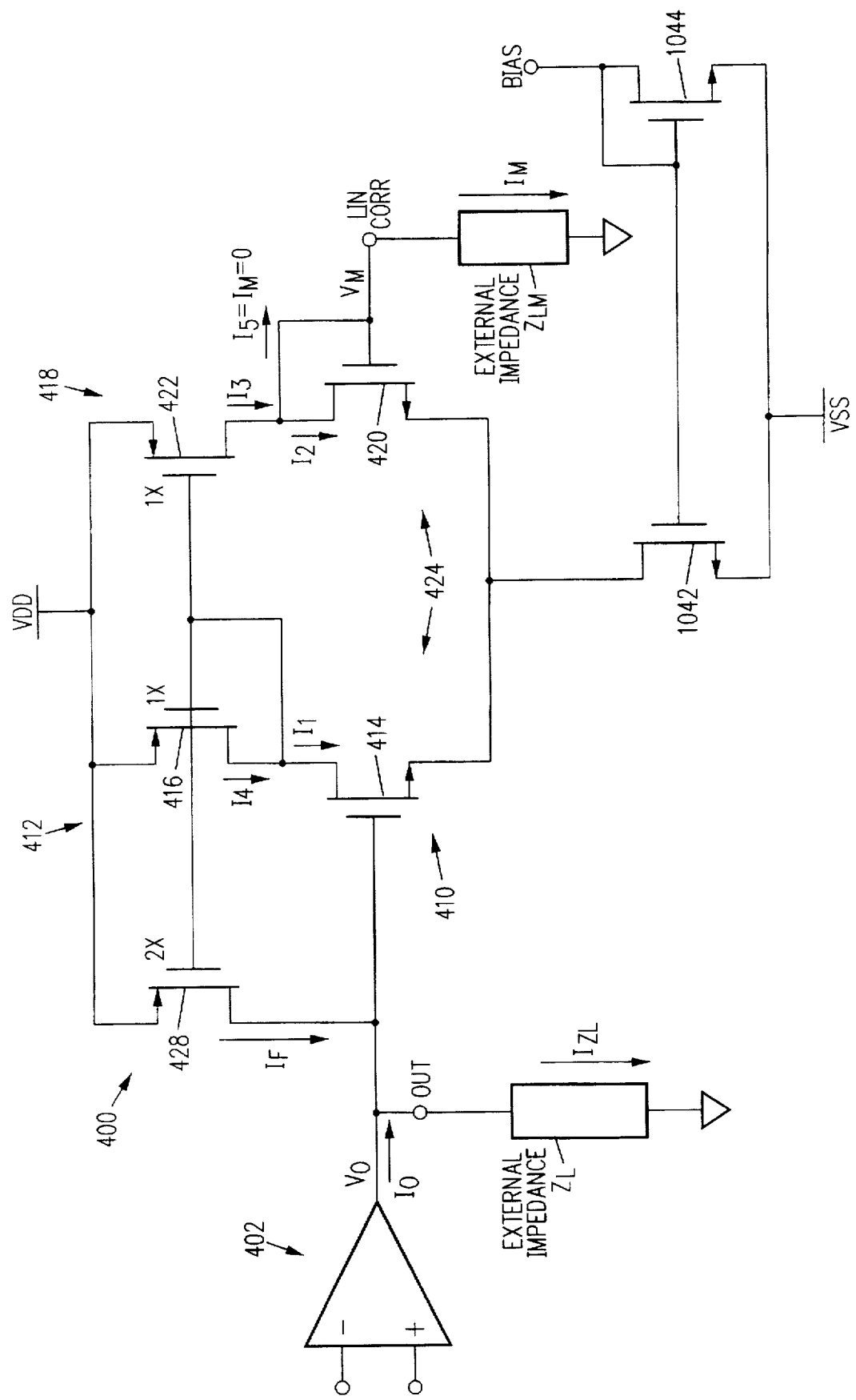
FIG. 10 is a schematic circuit diagram showing a current feedforward circuit suited for use with external loading circuitry in accordance with a further alternative embodiment of the present invention.
Figure 11:
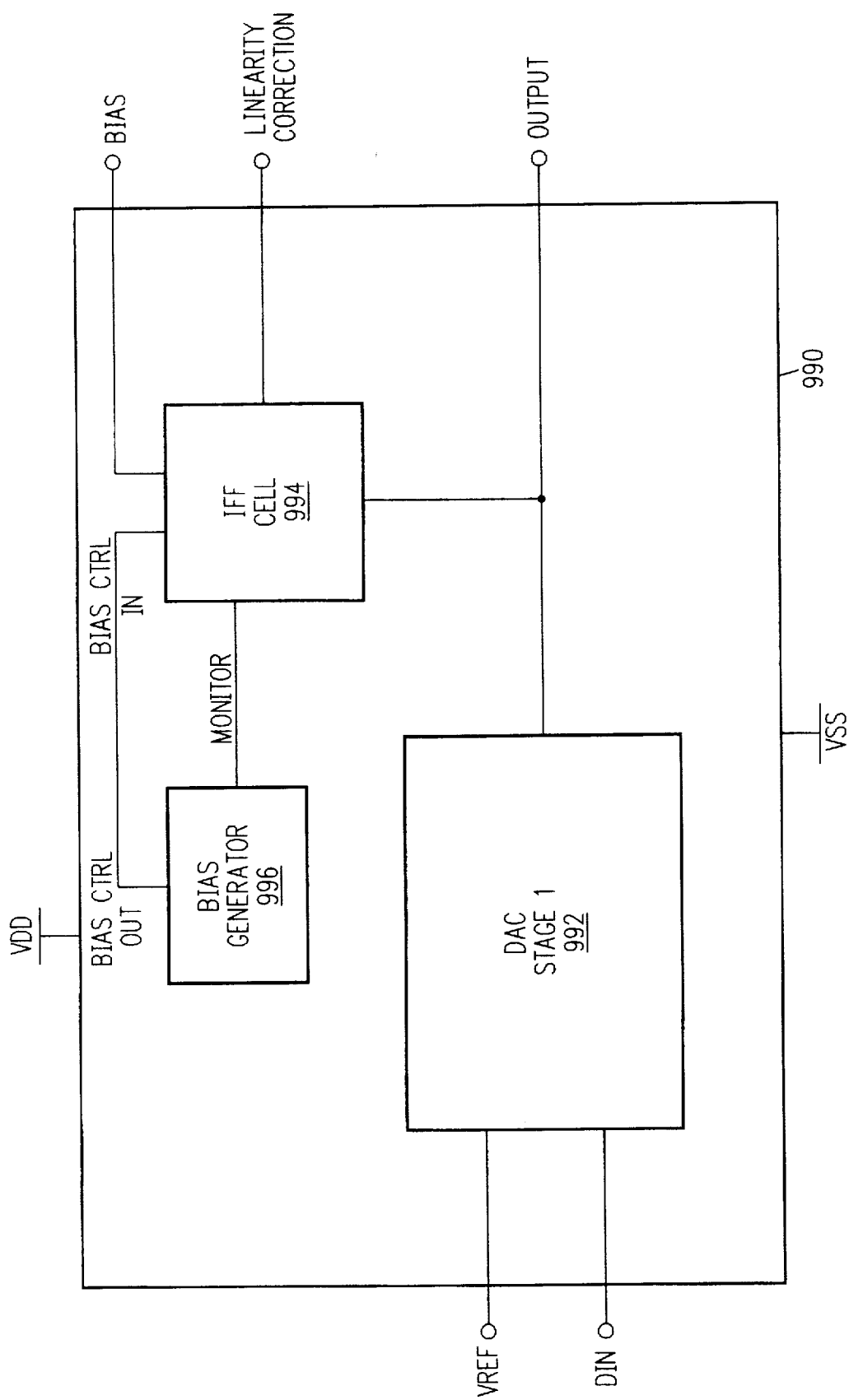
FIG. 11 is a block diagram of an integrated circuit implementation which incorporates the current feedforward circuit in accordance with the present invention.

Referring to FIG. 10, an alternative embodiment of a current feedforward circuit is illustrated which is substantially similar to the circuit shown in FIG. 4. However, the circuit shown in FIG. 10 includes additional circuit points for controlling and monitoring current feedforward operation. In particular, in some circuit embodiments, a linear correction pin LIN. CORR. is included on an integrated circuit chip upon which the current feedforward circuit is implemented. In such embodiments, the matched current load impedance $Z_{LM}$ is implemented off-chip so that an impedance may be selected that closely matches the load impedance $Z_L$, which is shown as an impedance that is external to the chip although the impedance may exist in various embodiments as either an on-chip or off-chip impedance. Accordingly, current feedforward performance is substantially improved. In addition, a monitoring connection MONITOR, which is shown in FIG. 11, may be implemented in some embodiments of the current feedforward circuit. The MONITOR connection, for example may be connected to the gate of PMOS mirror transistor 428 shown in FIG. 10. A voltage measured at the MONITOR connection allows monitoring of current flow in the feedforward circuit. The BIAS pin is included in some embodiments to control a bias current source (not shown). A bias current which is supplied at the BIAS pin is controlled by an external signal that is controlled by analog or digital selection.

In a particular embodiment, the MONITOR line allows monitoring of current $I_F$ for controlling the bias current on-chip using a bias generator 996, as is shown in FIG. 11. The bias generator 996 uses the monitor connection MONITOR to monitor the current $I_{ZL}$ or the current $I_F$ to adjust, in a manner known in the art, the bias for the particular implemented impedance $Z_{LM}$. In particular, the bias current is adjusted to a suitable low level.

In circuit embodiments implementing a linear correction pin LIN. CORR., a BIAS pin may be included so that the bias condition of the feedforward current $I_{FF}$ is adjustable, as needed. Using these pins, the bias is adjusted to a suitable value for the particular implemented impedance $Z_{LM}$ so that the bias current is reduced to a minimum level.

Referring to FIG. 11, an integrated circuit 990 implementation incorporates the current feedforward circuit and includes several control pins and a monitoring connection. The integrated circuit 990 includes a stage 1 switched capacitor digital-to-analog converter (DAC) 992 connected to a current feedforward cell 994. The integrated circuit 990 also includes a bias generator circuit 996 which is connected to the current feedforward cell 994 as shown in FIGS. 7 and 10. The integrated circuit 990 includes external pins and connections including a BIAS pin, a MONITOR connection and a LINEARITY CORRECTION pin which furnish functionality discussed with respect to the description of FIG. 10.

The description of certain embodiments of this invention is intended to be illustrative and not limiting. Numerous other embodiments will be apparent to those skilled in the art, all of which are included within the broad scope of this invention. For example, although the feedforward circuit is shown between a first and a second stage in a two-stage circuit, the feedforward circuit may be implemented in a multiple stage circuit having more than two stages.

Furthermore, although the transistors are shown to be NMOS and PMOS transistors in an NMOS drive circuit, an alternative PMOS drive circuit may be implemented by simple modifications that are known in the art. Furthermore, although the illustrative embodiments show utilization of MOSFET transistors, other types of transistors such as bipolar transistors and the like may be implemented within the scope of the invention. Similarly, combinations of MOSFET and bipolar transistors may be implemented in a biCMOS process, as is known in the art, to generate a circuit within the scope of the invention.

In the present invention, a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current-handling terminal may be arbitrarily deemed the "drain" and the other deemed the "source", with an implicit understanding that the two are not distinct, but interchangeable and defined by their usage.

What is claimed is:

1. A circuit comprising:
   a plurality of circuit stages including a switched-capacitor circuit stage;
   a load impedance following and coupled to the switched-capacitor circuit stage of the plurality of circuit stages, the load impedance loading the switched-capacitor circuit; and
   a current feedforward circuit coupled to the load impedance, the current feedforward circuit supplying a signal current to the load impedance that cancels the loading of the switched-capacitor circuit.

2. A circuit according to claim 1 wherein the current feedforward circuit includes a unity gain operational amplifier.

3. A circuit according to claim 1 wherein the current feedforward circuit includes:
   a differential pair of driver transistors including:
      an inverting-input driver transistor of a first conductivity type having a first current flow terminal, a second current flow terminal and a control terminal, the control terminal being coupled to the second current flow terminal; and
      a noninverting-input driver transistor of the first conductivity type having a first current flow terminal coupled to the inverting-input driver transistor first current flow terminal, a second current flow terminal and a control terminal;
   a first active load transistor of a second conductivity type opposite the first conductivity type having a first current flow terminal coupled to a power source, a second current flow terminal coupled to the second current flow terminal of the inverting-input driver transistor, and a control terminal;
   a second active load transistor of the second conductivity type having a control terminal, a first current flow terminal coupled to the first current flow terminal of the first active load transistor, and a second current flow terminal coupled to the control terminal and coupled to the second current flow terminal of the noninverting-input driver transistor;
   a feedforward current mirror transistor of the second conductivity type having a first current flow terminal coupled to the power source, a second current flow terminal coupled to the control terminal of the noninverting-input driver transistor, and a control terminal coupled to the control terminals of the first and second active load transistors;
   a current source coupled to the first current flow terminals of the inverting-input driver transistor and the noninverting-input driver transistor; and
   a current-matching impedance coupled to the control terminal of the inverting-input driver transistor.

4. A circuit according to claim 3 wherein:
   the current-feedforward circuit is fabricated in a single integrated circuit chip having a linearity correction pin coupled to the control terminal of the inverting-input driver transistor and an external current-matching impedance coupled to the linearity correction pin.

5. A circuit according to claim 3 wherein:
   the current-matching impedance is a resistance.

6. A circuit according to claim 3 wherein the driver transistors, active load transistors and the feedforward current mirror transistor are MOSFET transistors.

7. A circuit according to claim 3 wherein the driver transistors, active load transistors and the feedforward current mirror transistor are bipolar transistors.

8. A circuit according to claim 3 wherein the driver transistors, active load transistors and the feedforward current mirror transistor are combinations of MOSFET and bipolar transistors.

9. A circuit according to claim 3 wherein the feedforward current mirror transistor forms a 2X current mirror.

10. A circuit according to claim 1 wherein the current feedforward circuit includes:
   a differential pair of NMOS driver transistors including:
      an inverting-input NMOS driver transistor having a drain, a source and a gate coupled to the drain; and
      a noninverting-input NMOS driver transistor having a source coupled to the inverting-input NMOS driver transistor source, a drain and a gate;
   a first PMOS active load transistor having a drain coupled to the drain of the inverting-input NMOS driver transistor, a source coupled to a power source and a gate;
   a second PMOS active load transistor having a drain coupled to the drain of the noninverting-input NMOS driver transistor, a source coupled to the source of the first PMOS active load transistor and a gate coupled to the gate of the first PMOS active load transistor, the gate also being coupled to the drain;
   a feedforward current mirror PMOS transistor having a drain coupled to the gate of the noninverting-input NMOS driver transistor, a source coupled to the power source and a gate coupled to the gates of the first and second PMOS active load transistors;

a current source coupled to the sources of the inverting-input NMOS driver transistor and the noninverting-input NMOS driver transistor; and a load impedance coupled to the gate of the inverting-input NMOS driver transistor.

11. A circuit according to claim 1 wherein the current feedforward circuit includes:

a differential pair of driver transistors including:
an inverting-input driver transistor of a first conductivity type having a first current flow terminal, a second current flow terminal and a control terminal; and
a noninverting-input driver transistor of the first conductivity type having a first current flow terminal coupled to the inverting-input driver transistor first current flow terminal, a second current flow terminal and a control terminal;

a first active load transistor of a second conductivity type opposite the first conductivity type having a control terminal, a first current flow terminal coupled to a power source, and a second current flow terminal coupled to the second current flow terminal of the inverting-input driver transistor and coupled to the control terminal;

a second active load transistor of the second conductivity type having a first current flow terminal coupled to the first current flow terminal of the first active load transistor, a second current flow terminal coupled to the second current flow terminal of the noninverting-input driver transistor, and a control terminal coupled to the control terminal of the first active load transistor;

a feedforward transistor of the second conductivity type having a first current flow terminal coupled to the power source, a second current flow terminal coupled to the control terminal of the noninverting-input driver transistor, and a control terminal coupled to the second current flow terminal of the noninverting-input driver transistor;

a matching load transistor of the second conductivity type having a first current flow terminal coupled to the power source, a second current flow terminal coupled to the control terminal of the inverting-input driver transistor, and a control terminal coupled to the second current flow terminal of the noninverting-input driver transistor;

a biasing circuit coupled to the first current flow terminal of the inverting-input driver transistor and coupled to the first current flow terminal of the noninverting-input driver transistor including:
a first biasing circuit transistor of the first conductivity type having a first current flow terminal coupled to a voltage supply, a second current flow terminal coupled to the first current flow terminal of the inverting-input driver transistor and coupled to the first current flow terminal of the noninverting-input driver transistor, and a control terminal;
a second biasing circuit transistor of the first conductivity type having a first current flow terminal coupled to the first current flow terminal of the first biasing circuit transistor, a second current flow terminal and a control terminal, the second current flow terminal being coupled to the control terminal; and
a current source coupled to the second current flow terminal of the second biasing circuit transistor; and a current-matching impedance coupled to the control terminal of the inverting-input driver transistor.

12. A circuit according to claim 11 wherein:

the current-feedforward circuit is fabricated in a single integrated circuit chip having a linearity correction pin coupled to the control terminal of the inverting-input driver transistor and an external current-matching impedance coupled to the linearity correction pin.

13. A circuit according to claim 11 wherein:

the current-matching impedance is selected from impedances supplied by resistive, capacitive, inductive and combinations of resistive, capacitive and inductive loads.

14. A circuit according to claim 11 wherein the driver transistors, active load transistors and the feedforward current mirror transistor are MOSFET transistors.

15. A circuit according to claim 11 wherein the driver transistors, active load transistors and the feedforward transistor are bipolar transistors.

16. A circuit according to claim 11 wherein the driver transistors, active load transistors and the feedforward transistor are combinations of MOSFET and bipolar transistors.

17. A circuit according to claim 11 wherein the feedforward transistor forms a 2X current mirror.

18. A circuit according to claim 1 wherein the current feedforward circuit includes:

a differential pair of NMOS driver transistors including:
an inverting-input NMOS driver transistor having a drain, a source and a gate; and
a noninverting-input NMOS driver transistor having a source coupled to the inverting-input NMOS driver transistor source, a drain and a gate;

a first PMOS active load transistor having a drain coupled to the drain of the inverting-input NMOS driver transistor, a source coupled to a power source and a gate, the gate also being coupled to the drain;

a second PMOS active load transistor having a drain coupled to the drain of the noninverting-input NMOS driver transistor, a source coupled to the source of the first PMOS active load transistor and a gate coupled to the gate of the first PMOS active load transistor;

a feedforward PMOS transistor having a drain coupled to the gate of the noninverting-input NMOS driver transistor, a source coupled to the power source and a gate coupled to the drain of the noninverting-input NMOS driver transistor;

a matching load PMOS transistor having a drain coupled to the gate of the inverting-input NMOS driver transistor, a source coupled to the power source and a gate coupled to the drain of the noninverting-input NMOS driver transistor;

a biasing circuit coupled to the sources of the inverting-input NMOS driver transistor and the noninverting-input NMOS driver transistor including:
a first biasing circuit NMOS transistor having a drain coupled to the sources of the inverting-input NMOS driver transistor and the noninverting-input NMOS driver transistor, a source coupled to a voltage supply and a gate;
a second biasing circuit NMOS transistor having a drain, a source coupled to the source of the first biasing circuit NMOS transistor and a gate coupled to the gate of the first biasing circuit NMOS transistor, the gate and drain being intercoupled; and
a current source coupled to the drain of the second biasing circuit NMOS transistor; and a load impedance coupled to the gate of the inverting-input NMOS driver transistor.

19. A monolithic integrated circuit comprising:

a input pin, an output pin and a linearity connection pin;

a digital-to-analog converter circuit stage having a digital input terminal coupled to the input pin and an analog output terminal coupled to the output pin, the output pin being connected to a load impedance; and a current feedforward circuit coupled to the analog output terminal, the current feedforward circuit having a linearity correction terminal coupled to the linearity correction pin, the linearity correction pin being supplying a signal current to the load impedance that cancels the loading of the digital-to-analog converter stage.

20. A circuit according to claim 19 further comprising:

a bias pin, wherein:

the current feedforward circuit has a bias terminal coupled to the bias pin.

21. A circuit according to claim 19 further comprising:

a bias generator circuit having a bias terminal and a monitor terminal, wherein:

the current feedforward circuit has a bias terminal coupled to the bias terminal of the bias generator circuit and a monitor terminal coupled to the monitor terminal of the bias generator circuit; and the bias generator using the monitor connection to monitor current in the feedforward circuit and to adjust a bias current in the current feedforward circuit.

22. A circuit according to claim 19 wherein the current feedforward circuit includes:

a differential pair of driver transistors including:

an inverting-input driver transistor of a first conductivity type having a first current flow terminal, a second current flow terminal and a control terminal, the control terminal being coupled to the second current flow terminal; and a noninverting-input driver transistor of the first conductivity type having a first current flow terminal coupled to the inverting-input driver transistor first current flow terminal, a second current flow terminal and a control terminal;

a first active load transistor of a second conductivity type opposite the first conductivity type having a first current flow terminal coupled to a power source, a second current flow terminal coupled to the second current flow terminal of the inverting-input driver transistor, and a control terminal;

a second active load transistor of the second conductivity type having a control terminal, a first current flow terminal coupled to the first current flow terminal of the first active load transistor, and a second current flow terminal coupled to the control terminal and coupled to the second current flow terminal of the noninverting-input driver transistor;

a feedforward current mirror transistor of the second conductivity type having a first current flow terminal coupled to the power source, a second current flow terminal coupled to the control terminal of the noninverting-input driver transistor, and a control terminal coupled to the control terminals of the first and second active load transistors;

a current source coupled to the first current flow terminals of the inverting-input driver transistor and the noninverting-input driver transistor; and a current-matching impedance coupled to the control terminal of the inverting-input driver transistor.

23. A circuit according to claim 22 wherein the driver transistors, active load transistors and the feedforward current mirror transistor are MOSFET transistors.

24. A circuit according to claim 22 wherein the driver transistors, active load transistors and the feedforward current mirror transistor are bipolar transistors.

25. A circuit according to claim 22 wherein the driver transistors, active load transistors and the feedforward current mirror transistor are combinations of MOSFET and bipolar transistors.

26. A circuit according to claim 22 wherein the feedforward current mirror transistor forms a 2X current mirror.

27. A circuit according to claim 19 wherein the current feedforward circuit includes:

a differential pair of NMOS driver transistors including:

an inverting-input NMOS driver transistor having a drain, a source and a gate coupled to the drain; and a noninverting-input NMOS driver transistor having a source coupled to the inverting-input NMOS driver transistor source, a drain and a gate;

a first PMOS active load transistor having a drain coupled to the drain of the inverting-input NMOS driver transistor, a source coupled to a power source and a gate;

a second PMOS active load transistor having a drain coupled to the drain of the noninverting-input NMOS driver transistor, a source coupled to the source of the first PMOS active load transistor and a gate coupled to the gate of the first PMOS active load transistor, the gate also being coupled to the drain;

a feedforward current mirror PMOS transistor having a drain coupled to the gate of the noninverting-input NMOS driver transistor, a source coupled to the power source and a gate coupled to the gates of the first and second PMOS active load transistors;

a current source coupled to the sources of the inverting-input NMOS driver transistor and the noninverting-input NMOS driver transistor; and a load impedance coupled to the gate of the inverting-input NMOS driver transistor.

28. A circuit according to claim 19 wherein the current feedforward circuit includes:

a differential pair of driver transistors including:

an inverting-input driver transistor of a first conductivity type having a first current flow terminal, a second current flow terminal and a control terminal; and a noninverting-input driver transistor of the first conductivity type having a first current flow terminal coupled to the inverting-input driver transistor first current flow terminal, a second current flow terminal and a control terminal;

a first active load transistor of a second conductivity type opposite the first conductivity type having a control terminal, a first current flow terminal coupled to a power source, and a second current flow terminal coupled to the second current flow terminal of the inverting-input driver transistor and coupled to the control terminal;

a second active load transistor of the second conductivity type having a first current flow terminal coupled to the first current flow terminal of the first active load transistor, a second current flow terminal coupled to the second current flow terminal of the noninverting-input driver transistor, and a control terminal coupled to the control terminal of the first active load transistor;

a feedforward transistor of the second conductivity type having a first current flow terminal coupled to the power source, a second current flow terminal coupled to the control terminal of the noninverting-input driver transistor.

a current-matching impedance coupled to the control terminal of the inverting-input driver transistor.

29. A circuit according to claim 28 wherein:

the current-matching impedance is selected from impedances supplied by resistive, capacitive, inductive and combinations of resistive, capacitive and inductive loads.

30. A circuit according to claim 28 wherein the driver transistors, active load transistors and the feedforward current mirror transistor are MOSFET transistors.

31. A circuit according to claim 28 wherein the driver transistors, active load transistors and the feedforward current mirror transistor are bipolar transistors.

32. A circuit according to claim 28 wherein the driver transistors, active load transistors and the feedforward current mirror transistor are combinations of MOSFET and bipolar transistors.

33. A circuit according to claim 28 wherein the feedforward current mirror transistor forms a 2X current mirror.

34. A monolithic integrated circuit comprising:

an analog input pin, an output pin and a linearity connection pin;

a switched-capacitor stage having an analog input terminal coupled to the analog input pin and an output terminal coupled to the output pin, the output pin being connected to a load impedance; and a current feedforward circuit coupled to the analog output terminal, the current feedforward circuit having a linearity correction terminal coupled to the linearity correction pin, the linearity correction pin being supplying a signal current to the load impedance that cancels the loading of the switched-capacitor stage.

35. A circuit according to claim 34 further comprising:

a bias pin, wherein:

the current feedforward circuit has a bias terminal coupled to the bias pin.

36. A circuit according to claim 34 further comprising:

a bias generator circuit having a bias terminal and a monitor terminal, wherein:

the current feedforward circuit has a bias terminal coupled to the bias terminal of the bias generator circuit and a monitor terminal coupled to the monitor terminal of the bias generator circuit; and the bias generator using the monitor connection to monitor current in the feedforward circuit and to adjust a bias current in the current feedforward circuit.

37. A circuit according to claim 34 wherein the current feedforward circuit includes:

a differential pair of driver transistors including:

an inverting-input driver transistor of a first conductivity type having a first current flow terminal, a second current flow terminal and a control terminal, the control terminal being coupled to the second current flow terminal; and a noninverting-input driver transistor of the first conductivity type having a first current flow terminal coupled to the inverting-input driver transistor first current flow terminal, a second current flow terminal and a control terminal;

a first active load transistor of a second conductivity type opposite the first conductivity type having a first current flow terminal coupled to a power source, a second current flow terminal coupled to the second current flow terminal of the inverting-input driver transistor, and a control terminal;

a second active load transistor of the second conductivity type having a control terminal, a first current flow terminal coupled to the first current flow terminal of the first active load transistor, and a second current flow terminal coupled to the control terminal and coupled to the second current flow terminal of the noninverting-input driver transistor;

a feedforward current mirror transistor of the second conductivity type having a first current flow terminal coupled to the power source, a second current flow terminal coupled to the control terminal of the noninverting-input driver transistor, and a control terminal coupled to the control terminals of the first and second active load transistors;

a current source coupled to the first current flow terminals of the inverting-input driver transistor and the noninverting-input driver transistor; and a current-matching impedance coupled to the control terminal of the inverting-input driver transistor.

38. A circuit according to claim 37 wherein the driver transistors, active load transistors and the feedforward current mirror transistor are MOSFET transistors.

39. A circuit according to claim 37 wherein the driver transistors, active load transistors and the feedforward current mirror transistor are bipolar transistors.

40. A circuit according to claim 37 wherein the driver transistors, active load transistors and the feedforward current mirror transistor are combinations of MOSFET and bipolar transistors.

41. A circuit according to claim 37 wherein the feedforward current mirror transistor forms a 2X current mirror.

42. A circuit according to claim 34 wherein the current feedforward circuit includes:

a differential pair of NMOS driver transistors including:

an inverting-input NMOS driver transistor having a drain, a source and a gate coupled to the drain; and a noninverting-input NMOS driver transistor having a source coupled to the inverting-input NMOS driver transistor source, a drain and a gate;

a first PMOS active load transistor having a drain coupled to the drain of the inverting-input NMOS driver transistor, a source coupled to a power source and a gate;

a second PMOS active load transistor having a drain coupled to the drain of the noninverting-input NMOS driver transistor, a source coupled to the source of the first PMOS active load transistor and a gate coupled to the gate of the first PMOS active load transistor, the gate also being coupled to the drain;

a feedforward current mirror PMOS transistor having a drain coupled to the gate of the noninverting-input NMOS driver transistor, a source coupled to the power source and a gate coupled to the gates of the first and second PMOS active load transistors;

a current source coupled to the sources of the inverting-input NMOS driver transistor and the noninverting-input NMOS driver transistor; and a load impedance coupled to the gate of the inverting-input NMOS driver transistor.

43. A circuit according to claim 34 wherein the current feedforward circuit includes:

a differential pair of driver transistors including:

an inverting-input driver transistor of a first conductivity type having a first current flow terminal, a second current flow terminal and a control terminal; and a noninverting-input driver transistor of the first conductivity type having a first current flow terminal coupled to the inverting-input driver transistor first current flow terminal, a second current flow terminal and a control terminal;

a first active load transistor of a second conductivity type opposite the first conductivity type having a control terminal, a first current flow terminal coupled to a power source, and a second current flow terminal coupled to the second current flow terminal of the inverting-input driver transistor and coupled to the control terminal;

a second active load transistor of the second conductivity type having a first current flow terminal coupled to the first current flow terminal of the first active load transistor, a second current flow terminal coupled to the second current flow terminal of the noninverting-input driver transistor, and a control terminal coupled to the control terminal of the first active load transistor;

a feedforward transistor of the second conductivity type having a first current flow terminal coupled to the power source, a second current flow terminal coupled to the control terminal of the noninverting-input driver transistor, a current-matching impedance coupled to the control terminal of the inverting-input driver transistor.

44. A circuit according to claim 43 wherein:

the current-matching impedance is selected from impedances supplied by resistive, capacitive, inductive and combinations of resistive, capacitive and inductive loads.

45. A circuit according to claim 43 wherein the driver transistors, active load transistors and the feedforward current mirror transistor are MOSFET transistors.

46. A circuit according to claim 43 wherein the driver transistors, active load transistors and the feedforward current mirror transistor are bipolar transistors.

47. A circuit according to claim 43 wherein the driver transistors, active load transistors and the feedforward current mirror transistor are combinations of MOSFET and bipolar transistors.

48. A circuit according to claim 43 wherein the feedforward current mirror transistor forms a 2X current mirror.

* * * * *